US010854455B2

(12) United States Patent
Chang et al.

(10) Patent No.: US 10,854,455 B2
(45) Date of Patent: Dec. 1, 2020

(54) METHODS AND APPARATUS FOR FABRICATING IC CHIPS WITH TILTED PATTERNING

(71) Applicant: Marvell World Trade Ltd., St. Michael (BB)

(72) Inventors: Runzi Chang, San Jose, CA (US); Winston Lee, Palo Alto, CA (US)

(73) Assignee: Marvell Asia PTE, Ltd., Singapore (SG)

( * ) Notice: Subject to any disclaimer, the term of this patent is extended or adjusted under 35 U.S.C. 154(b) by 173 days.

(21) Appl. No.: 15/818,510

(22) Filed: Nov. 20, 2017

(65) Prior Publication Data

US 2018/0144941 A1 May 24, 2018

Related U.S. Application Data

(60) Provisional application No. 62/424,971, filed on Nov. 21, 2016.

(51) Int. Cl.
| | |
|---|---|
| *H01L 21/26* | (2006.01) |
| *H01L 21/265* | (2006.01) |
| *G03F 7/20* | (2006.01) |
| *H01L 21/3213* | (2006.01) |
| *G03F 7/11* | (2006.01) |
| *H01L 21/027* | (2006.01) |

(Continued)

(52) U.S. Cl.
CPC .......... *H01L 21/26586* (2013.01); *G03F 7/11* (2013.01); *G03F 7/201* (2013.01); *H01L 21/0274* (2013.01); *H01L 21/0276* (2013.01); *H01L 21/02126* (2013.01); *H01L 21/3086* (2013.01); *H01L 21/31055* (2013.01); *H01L 21/31144* (2013.01); *H01L 21/32139* (2013.01); *H01L 21/56* (2013.01); *H01L 24/06* (2013.01)

(58) Field of Classification Search
CPC ......... H01L 21/26586; H01L 21/32139; H01L 21/0274; H01L 21/31055; H01L 21/31144; H01L 24/06; H01L 21/0276; H01L 21/56; H01L 21/3086; H01L 21/02126; G03F 7/201; G03F 7/11
See application file for complete search history.

(56) References Cited

U.S. PATENT DOCUMENTS

| | | | | |
|---|---|---|---|---|
| 5,087,535 A | * | 2/1992 | Hirokane | G03F 1/54 369/277 |
| 5,306,390 A | * | 4/1994 | Peek | H01L 21/0274 257/E21.027 |

(Continued)

OTHER PUBLICATIONS

"Photolithography", Wikipedia; retrieved on Apr. 5, 2017; Indicated as last modified on Mar. 20, 2017, 9 pages.

*Primary Examiner* — Charles D Garber
*Assistant Examiner* — S M Sohel Imtiaz

(57) ABSTRACT

The present disclosure describes methods and apparatuses for fabricating integrated-circuit (IC) die with tilted patterning. In some aspects, mandrels are fabricated on a material stack and occlude portions of a layer of material from a field of energy radiated at an angle of incidence relative to the mandrels. The occluded portions of the layer of material can be used to mask an underlying film to create a film pattern on a substrate of the IC die. These methods and apparatuses may enable the fabrication of IC die with features that are smaller in size than those afforded by conventional lithography processes.

26 Claims, 13 Drawing Sheets

(51) Int. Cl.
*H01L 21/02* (2006.01)
*H01L 21/308* (2006.01)
*H01L 21/3105* (2006.01)
*H01L 21/311* (2006.01)
*H01L 21/56* (2006.01)
*H01L 23/00* (2006.01)

(56) References Cited

U.S. PATENT DOCUMENTS

| | | | | |
|---|---|---|---|---|
| 5,760,461 A * | 6/1998 | Cronin | ............ | G03F 7/00 257/622 |
| 5,913,102 A * | 6/1999 | Yang | ............ | G03F 7/00 257/E21.257 |
| 6,093,637 A * | 7/2000 | Kishimoto | ............ | H01L 21/02126 257/E21.245 |
| 6,194,268 B1 * | 2/2001 | Furukawa | ............ | G03F 7/0035 438/257 |
| 6,319,822 B1 * | 11/2001 | Chen | ............ | H01L 21/0332 257/E21.035 |
| 7,713,882 B2 * | 5/2010 | Huang | ............ | H01L 21/0332 438/735 |
| 7,960,090 B2 * | 6/2011 | Terasaki | ............ | G03F 7/0017 430/270.1 |
| 7,960,096 B2 * | 6/2011 | Abraham | ............ | H01L 21/32139 430/313 |
| 2004/0002203 A1 * | 1/2004 | Deshpande | ............ | H01L 21/3088 438/525 |
| 2005/0124151 A1 * | 6/2005 | Cheng | ............ | H01L 21/76819 438/623 |
| 2006/0166419 A1 * | 7/2006 | Shimoyama | ............ | H01L 29/66621 438/173 |
| 2007/0269957 A1 * | 11/2007 | Cha | ............ | H01L 21/76243 438/423 |
| 2009/0163030 A1 * | 6/2009 | Omura | ............ | H01L 21/0337 438/703 |
| 2010/0140698 A1 * | 6/2010 | Roig-Guitart | ............ | H01L 29/0634 257/335 |
| 2012/0273881 A1 * | 11/2012 | French | ............ | H01L 29/7824 257/339 |
| 2014/0361378 A1 * | 12/2014 | Lee | ............ | H01L 29/20 257/369 |
| 2016/0093552 A1 * | 3/2016 | Venugopal | ............ | H01L 23/3675 257/29 |
| 2016/0141387 A1 * | 5/2016 | Tseng | ............ | H01L 29/66795 257/401 |
| 2017/0005206 A1 * | 1/2017 | Moslehi | ............ | H01L 31/1896 |
| 2017/0194490 A1 * | 7/2017 | Li | ............ | H01L 21/76897 |
| 2017/0221929 A1 * | 8/2017 | Yu | ............ | H01L 21/26513 |
| 2017/0352586 A1 * | 12/2017 | Venkatasubramanian | ............ | H01L 27/11556 |

* cited by examiner

METHODS AND APPARATUS FOR FABRICATING IC CHIPS WITH TILTED PATTERNING

CROSS REFERENCE TO RELATED APPLICATION

This present disclosure claims priority to U.S. Provisional Patent Application Ser. No. 62/424,971 filed Nov. 21, 2016 the disclosure of which is incorporated by reference herein in its entirety.

BACKGROUND

Conventional techniques for fabricating an integrated-circuit (IC) chip, or die, typically rely on a lithography process in which an energy field is radiated through a mask and lens onto a semiconductor wafer. A developing process then removes sections of material from the semiconductor wafer that were exposed to the radiated energy. Underlying portions of material are often removed via an etching process to create a pattern of IC die features that correlate to the mask through which the energy field is radiated. Minimum sizes of the IC die features produced by this process are typically limited by the lens system, the optical properties of which are constrained by diffraction laws of physics. In some cases, multiple lithography-etch cycles (e.g., double patterning) are used to extend capabilities of the lens system to produce smaller features by splitting a pattern of desired IC die features into multiple interleaved patterns of multiple respective masks. The use of multiple lithography-etch cycles, however, often increases defect densities of IC die features, introduces additional process complexities, and adds to the total cost of fabricating IC die.

SUMMARY

This summary is provided to introduce subject matter that is further described in the Detailed Description and Drawings. Accordingly, this Summary should not be considered to describe essential features nor used to limit the scope of the claimed subject matter.

In some aspects, a method is described that deposits, on a film to be patterned, a material stack comprising a first layer of material that is sensitive to radiated energy and a second layer of material that is not sensitive to radiated energy. Mandrels are then fabricated on the material stack, after which a field of collimated energy is radiated at an angle of incidence with respect to the mandrels. The mandrels occlude portions of the first layer of material from the field of collimated energy and expose other portions of the first layer of material to the field of collimated energy. After removing the mandrels from the material stack, the second layer of material and the other portions of the first layer of material that were exposed to the energy are removed. Portions of the film that are no longer masked by the portions of the first layer of material are removed, after which unexposed portions of the first layer of material are removed to reveal the patterned film.

In other aspects, an apparatus is described that comprises a first module, a second module, and a control system for the modules. The first module is configured to radiate a collimated energy field through a lithography mask and lens system. The second module is configured to position a semiconductor wafer with respect to the first module or energy radiated therefrom. The control system is configured to control the first module or the second module of the apparatus such that an angle of incidence of the collimated energy field relative to the semiconductor wafer may be varied from a normal angle of incidence.

The details of one or more implementations are set forth in the accompanying drawings and the following description. Other features and advantages will be apparent from the description and drawings, and from the claims.

BRIEF DESCRIPTION OF THE DRAWINGS

The details of one or more aspects of tilted patterning for fabricating IC die are described below. The use of the same reference numbers in different instances in the description and the figures may indicate like elements.

DETAILED DESCRIPTION

Figure 1:
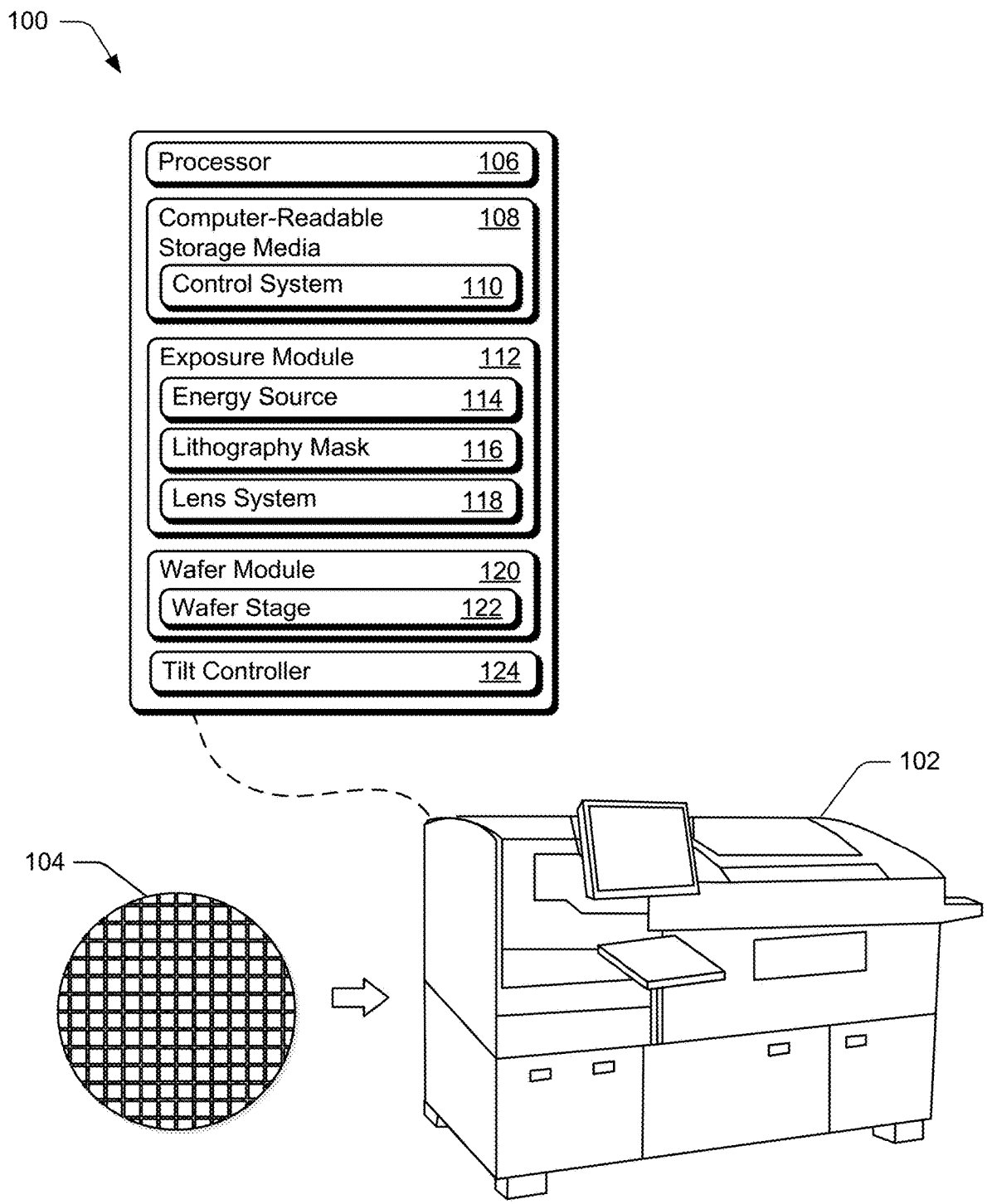
FIG. 1 illustrates an example operating environment that includes a lithography tool for patterning IC dies in accordance with one or more aspects.

Conventional fabrication processes to create lines, spaces, trenches, contacts, vias, and other features of integrated-circuit (IC) die typically rely on optical lithography process that is limited by the laws of physics related to optics of a lens. In particular, consider Reyleigh's equation, which is:

$$K = k_1(\lambda/NA)$$

where R is a minimum half pitch or resolution, $\lambda$ is a wavelength of light used, NA is a numerical aperture of the lens system, and $k_1$ is a process capability factor. Gated by capabilities of optical physics today, engineering efforts are producing minimum resolutions, or feature sizes, of approximately 38 nm for a single lithography cycle. In order to fabricate IC die features of smaller sizes, multiple lithography-etch cycles may split a pattern for producing the IC die features into multiple interleaved patterns on multiple respective masks. Each additional lithography-etch cycle associated with implementing the multiple interleaved patterns, however, requires another set of expensive minimum-resolution lithography-etch tools, which increases costs associated with fabricating the IC die. Furthermore, the additional lithography-etch cycles often increase defect densities of the IC die features that contribute to decreased IC die yields and more scrap cost per semiconductor wafer.

This disclosure describes apparatuses and techniques for fabricating IC die with tilted patterning. These apparatuses and techniques may be implemented to produce IC die that have smaller features, with fewer lithography-etch operations, and/or at reduced cost. In some aspects, mandrels are fabricated on a material stack that covers a film to be patterned as part an IC die fabrication process. The mandrels may occlude (e.g., shade) portions of a layer of the material stack from a collimated field of energy that is radiated, by a lithography tool, at an angle of incidence (e.g., tilted) relative to the mandrels. After removing the mandrels, a series of processing steps may remove portions or layers of the material stack to expose portions of the underlying film. These exposed portions of film are then removed effective to pattern remaining portions of the film to enable fabrication of features smaller than those afforded by conventional lithography processes. By so doing, IC die may be fabricated using fewer lithography-etch cycles and with reduced defect densities of IC die features.

These and other aspects described herein may be implemented to fabricate, using fewer lithography-etch cycles and lower-cost tools, IC die having minimum feature sizes that extend below those afforded by conventional lithography processes. In some cases, aspects of tilted patterning are implemented to fabricate an IC die with highly regular or repetitive features, such as a memory die or a processor die. Alternately or additionally, techniques of tilted patterning may be combined with other lithography processes to fabricate an IC die having a combination of high-density patterns and low-density patterns, such as a System on Chip (SoC) die or Ultra Large Scale Integration (VLSI) device.

The following discussion describes an operating environment, techniques that may be employed in the operating environment, and lithography tools in which components of the operating environment can be embodied. In the context of the present disclosure, reference is made to the operating environment by way of example only.

Operating Environment

FIG. 1 illustrates an example operating environment 100 that includes a lithography tool 102. The lithography tool 102 includes mechanisms and controls for radiating energy onto a surface of a semiconductor wafer 104 of IC die as part of a lithography patterning process. The energy radiated or emitted by the lithography tool 102 may include any suitable type of electromagnetic energy or particles, such as ultra-violet light (UV), extreme-ultraviolet (EUV) light, electron-beams, ion-beams, or x-ray EM waves. The lithography tool 102 includes a processor 106 and computer-readable storage media 108 (CRM 108) storing instructions that, when executed, cause the processor to perform operations as part of the lithography patterning process. For example, the CRM 108 may store firmware or software of the lithography tool 102 that is executed by the processor 106 to implement functionalities of the lithography tool 102.

In the context of the operating environment 100, the semiconductor wafer 104 is exposed to radiated energy originating from an exposure module 112 of the lithography tool 102. In this example, an exposure module 112 of the tool includes an energy source 114, a lithography mask 116, and a lens system 118 for implementing various lithography operations. The energy source 114 can generate or emit energy in the form of UV light, EUV light, electron beams (e-beams), ion beams, or x-ray EM waves. The energy of the energy source 114 is radiated through the lithography mask 116, which may be configured to define a pattern (e.g., image or scaled image) of integrated-circuit (IC) die for projection onto the surface of the semiconductor wafer 104. Energy that passes through the lithography mask 116 enters a reducing lens of the lens system 118. The lens system 118 may reduce, or shrink, the pattern of the lithography mask 116 to sizes suitable for forming the IC die features on the semiconductor wafer 104.

The lithography tool 102 also includes a wafer module 120 for supporting or manipulating the semiconductor wafer 104 relative other components of the exposure module 112, such as the energy source 114 or the lens system 118.

The lithography tool 102 also includes a tilt controller 124. The tilt controller 124 is used to control tilting of components of either the exposure module 112 or the wafer module 120.

Figure 2:
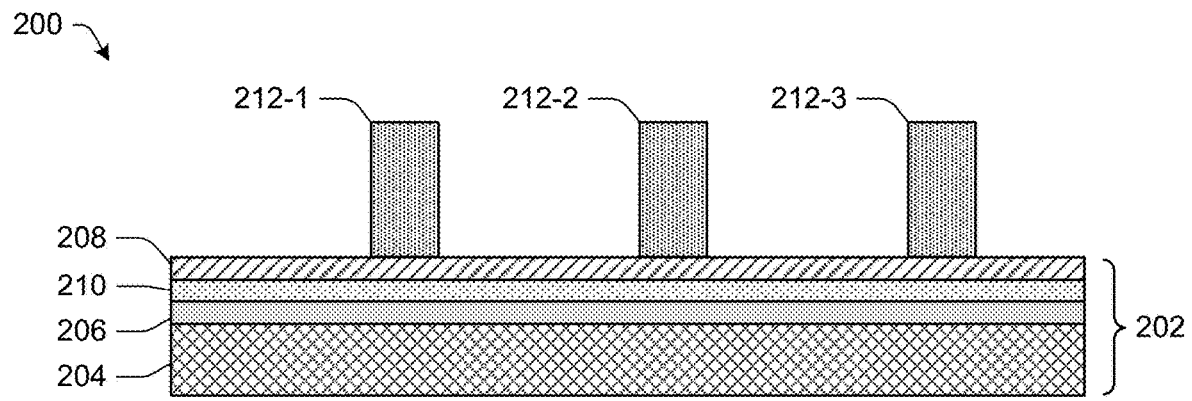
FIG. 2 illustrates example cross sections of a semiconductor wafers with various material stack and mandrel configurations.
Figure 2:
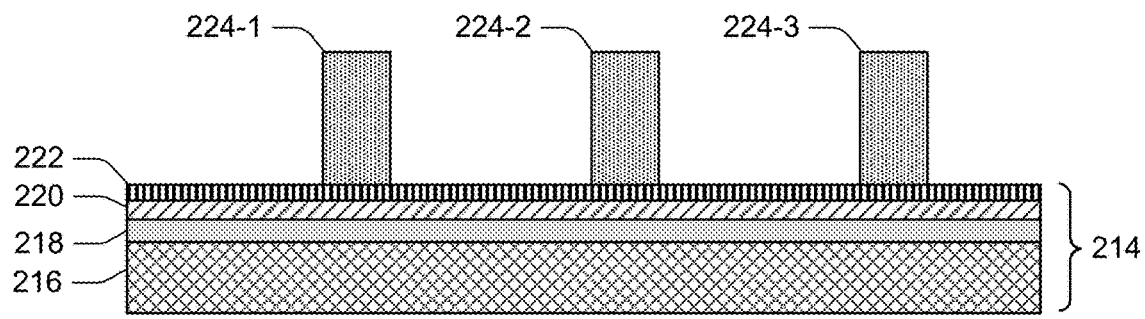
Figure 2:
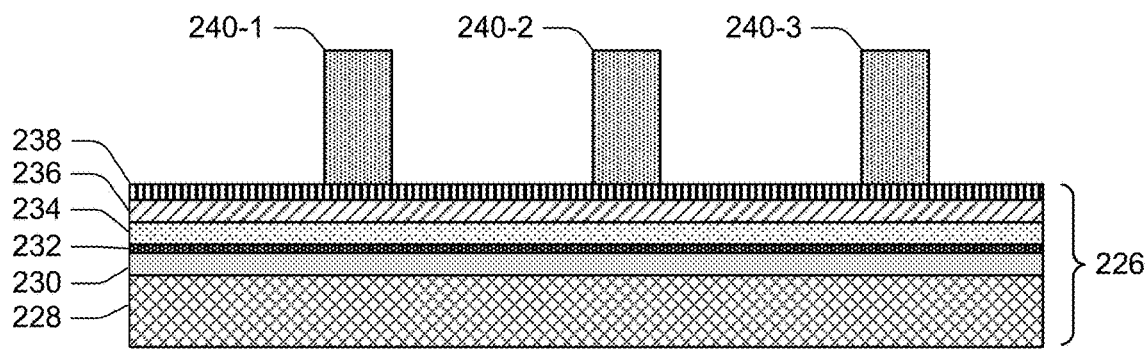

FIG. 2 illustrates example cross sections of semiconductor wafers with various material stack and mandrel configurations in accordance with one or more aspects generally at 200.

As shown in FIG. 2, the semiconductor wafer 202 includes a silicon substrate 204 that is covered with a film 206 to be patterned. The film 206 may be, for example, a polysilicon or dielectric layer. On top of film 206 to be patterned is a material stack, including a first layer of material 208 over a second layer of material 210. The first layer of material 208 is a material which is sensitive to energy that may be radiated onto the semiconductor wafer 202 and may be, for example, a positive photoresist material. The second layer of material 210 is a material which is not sensitive to energy that may be radiated onto the semiconductor wafer 202 and may be a hard mask material such as a silicon nitride material, a silicon oxynitride material, or a titanium nitride material. On top of the material stack are mandrels 212-1 through 212-3 which are fabricated using general or low cost lithography processes. The mandrels 212-1 through 212-3 may be fabricated from a material that prevents, or occludes, radiated energy from passing through the mandrels and interacting with the first layer of material 208.

As another example, consider the semiconductor wafer 214 of FIG. 2 that includes a silicon substrate 216 that is covered with a film 218 to be patterned. The film 218 may be, for example, a polysilicon or dielectric film. On top of film 218 to be patterned is a material stack, including a first layer of material 220 under and a second layer of material 222. The first layer of material 220 is a material which is sensitive to energy that may be radiated onto the semiconductor wafer 214 and may be, for example, a positive photoresist material. The second layer of material 222 is a material which is not sensitive to energy that may be radiated onto the semiconductor wafer 214 and may be, for example, a silicon dioxide material implanted with argon or oxygen. On top of the material stack are mandrels 224-1 through 224-3 which are fabricated using general or low cost lithography processes. The mandrels 224-1 through 224-3 may be fabricated from a material that prevents, or occludes, radiated energy from passing through the mandrels and interacting with the first layer of material 220.

In addition to the configurations of the semiconductor wafer 202 and the semiconductor wafer 214 multiple, additional permutations of material stacks are possible. As illustrated by the cross section of the semiconductor wafer 226, a silicon substrate 228 is covered with a film 230 to be patterned. On top of the film 230 to be patterned is an example four-layer material stack comprised of a first layer of material 232 which may be, for example, an anti-reflective coating material; a second layer of material 234 which may be, for example, a hard mask material such as a silicon nitride material, a silicon oxynitride material, or a titanium nitride material; a third layer of material 236 which may be, for example, a material which is sensitive to radiated energy such as a positive photoresist material; and a fourth layer of material 238 which may be, for example, a silicon dioxide material. On top of the material stack are mandrels 240-1 through 240-3, which are fabricated using general or low cost lithography processes. The mandrels 240-1 through 240-3 may be fabricated from a material that prevents, or occludes, radiated energy from passing through the mandrels. Although the semiconductor wafer 226 with a four-layer material stack is a particular aspect, it is meant to illustrate one of many possible configurations by way of example only and is not meant to be limiting. A particular quantity or ordering of layers of material within the material stack, as selected from available permutations, may be determined based on desired IC die properties, manufacturing process capabilities, manufacturing cost constraints, and the like.

Techniques for IC Fabrication with Tilted Patterning

The following discussion describes techniques for tilted patterning. These techniques can be implemented using any of the environments and entities described herein, such as the operating environment 100 including the lithography tool 102, control system 110, and tilt controller 124. These methods are not necessarily limited to the orders of operations shown. Rather, any of the operations may be repeated, skipped, substituted, or re-ordered to implement various aspects described herein. Further, these methods may be used in conjunction with one another, in whole or in part, whether performed by the same entity, separate entities, or any combination thereof. In portions of the following discussion, reference will be made to operating environment 100 of FIG. 1 and entities of FIG. 2 by way of example. Such reference is not to be taken as limiting described aspects to operating environment 100 but rather as illustrative of one of a variety of examples.

Figure 3:
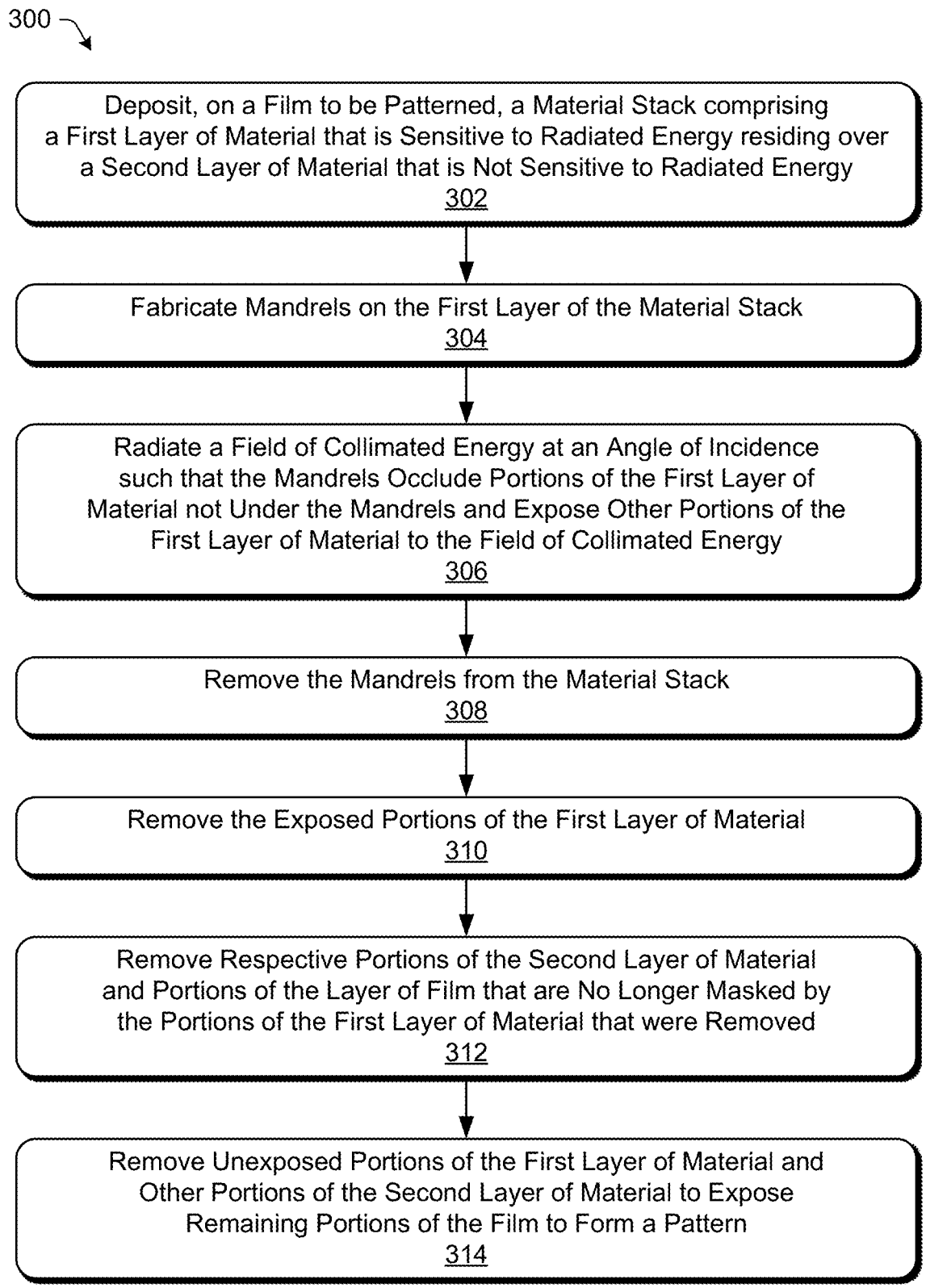
FIG. 3 depicts an example method for fabricating an IC die in accordance with one or more aspects.

FIG. 3 depicts an example method 300 for fabricating an IC die in accordance with one or more aspects, including operations performed by the lithography tool 102, control system 110, or tilt controller 124 of FIG. 1.

At 302, a material stack is deposited on a film to be patterned on a semiconductor wafer as part of an IC die fabrication process. The material stack is comprised of a first layer of material residing over a second layer of material. In some aspects, the first layer of material is a material that is sensitive to radiated energy while the second layer of material is a material that is not sensitive to radiated energy.

Figure 4A:
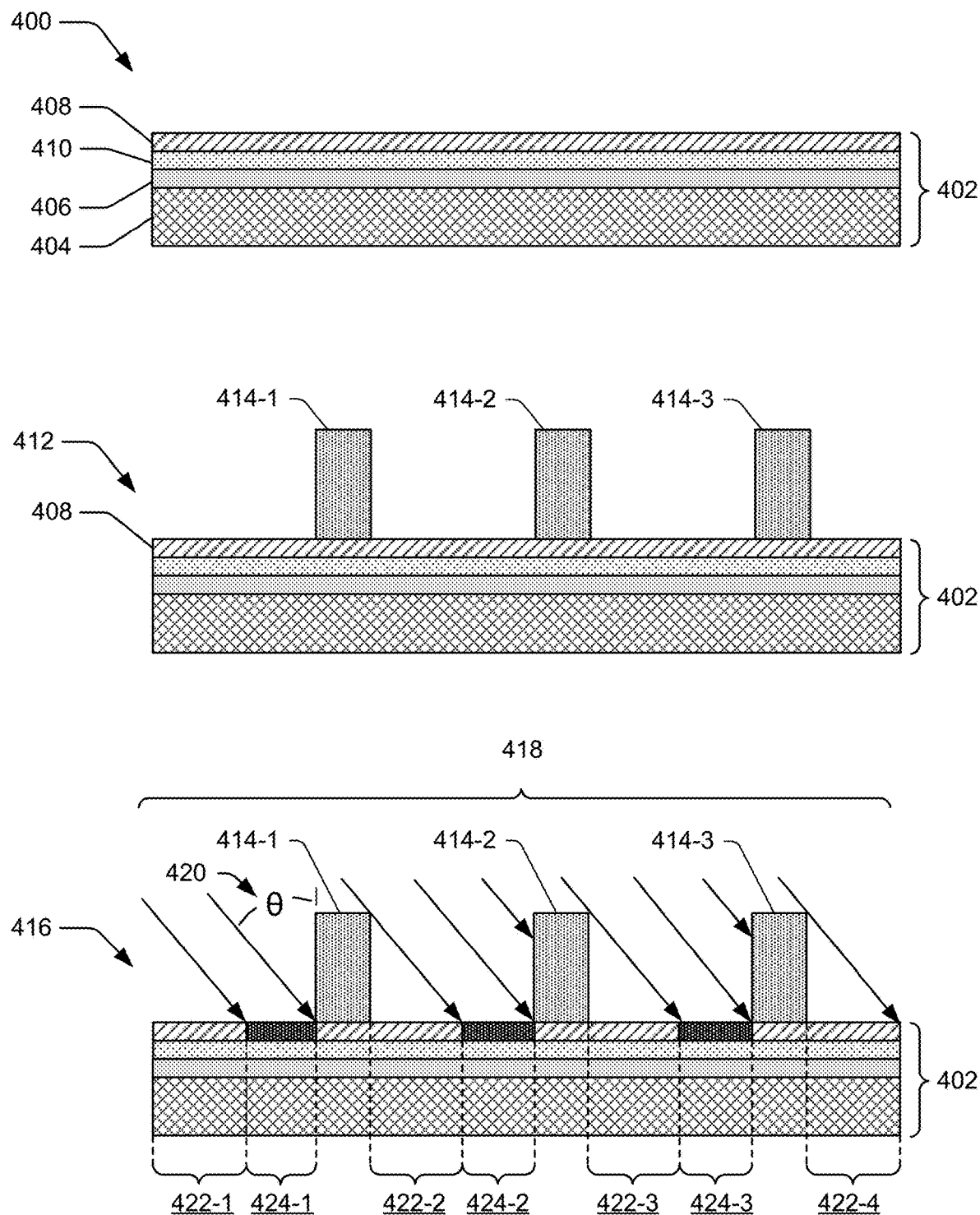
FIGS. 4a and 4b illustrate example cross sections of an IC die at various stages of being fabricated in accordance with one or more aspects.

By way of example consider FIG. 4a, which illustrates example cross sections of an IC die at various stages of being fabricated in accordance with one or more aspects. As shown at 400, the semiconductor wafer 402 includes a silicon substrate 404 and a film 406 to be patterned. On top of the film 406 to be patterned is a material stack comprised of first layer of material 408 over a second layer of material 410. In this example, the first layer of material 408 is comprised of a material which is sensitive to radiated energy which may be a positive photoresist material. The second layer of material 410 is comprised of a material which is not sensitive to radiated energy which may be a hard mask material such as a silicon nitride material, a silicon oxynitride material, or a titanium nitride material. The film 406, the first layer of material 408, and the second layer of material 410 may be blanketly formed using any one of a number of semiconductor manufacturing processes including a chemical vapor deposition (CVD) process or a spin-coat process.

At 304, mandrels are fabricated on the first layer of the material stack. In the context of the present example and as shown at 412, mandrels 414-1 through 414-3 are fabricated on the first layer of material 408 of the material stack. The mandrels 414-1 through 414-3 may be fabricated using a low cost lithography and etch process and materials that do not transmit radiated energy.

At 306, a field of collimated energy is radiated at an angle of incidence such that the mandrels fabricated on the material stack occlude portions of the first layer of material not under the mandrels from the field of collimated energy and expose other portions of the first layer of material to the field of collimated energy.

Continuing with the ongoing example and as shown at 416, a field of collimated energy 418 is radiated at an angle of incidence 420 relative to the mandrels 414-1 through 414-3 using a lithography tool, such as the lithography tool 102 having the tilt controller 124. In such an instance, the angle of incidence 420 may be a result of the tilt controller 124 varying an angular position of one or more components of either the exposure module 112 or the wafer module 120 of the lithography tool 102. The angle of incidence 420 is such that portions of the first layer of material 422-1 through 422-4 are occluded from the field of collimated energy 418 (portion 422-1 is occluded from the field of collimated energy 418 by a mandrel which is not illustrated, while portions 422-2 through 422-4 are occluded, respectively, by mandrels 414-1 through 414-3). Other portions of the first layer of material 424-1 through 424-3 are exposed to the field of collimated energy 418.

Figure 4B:
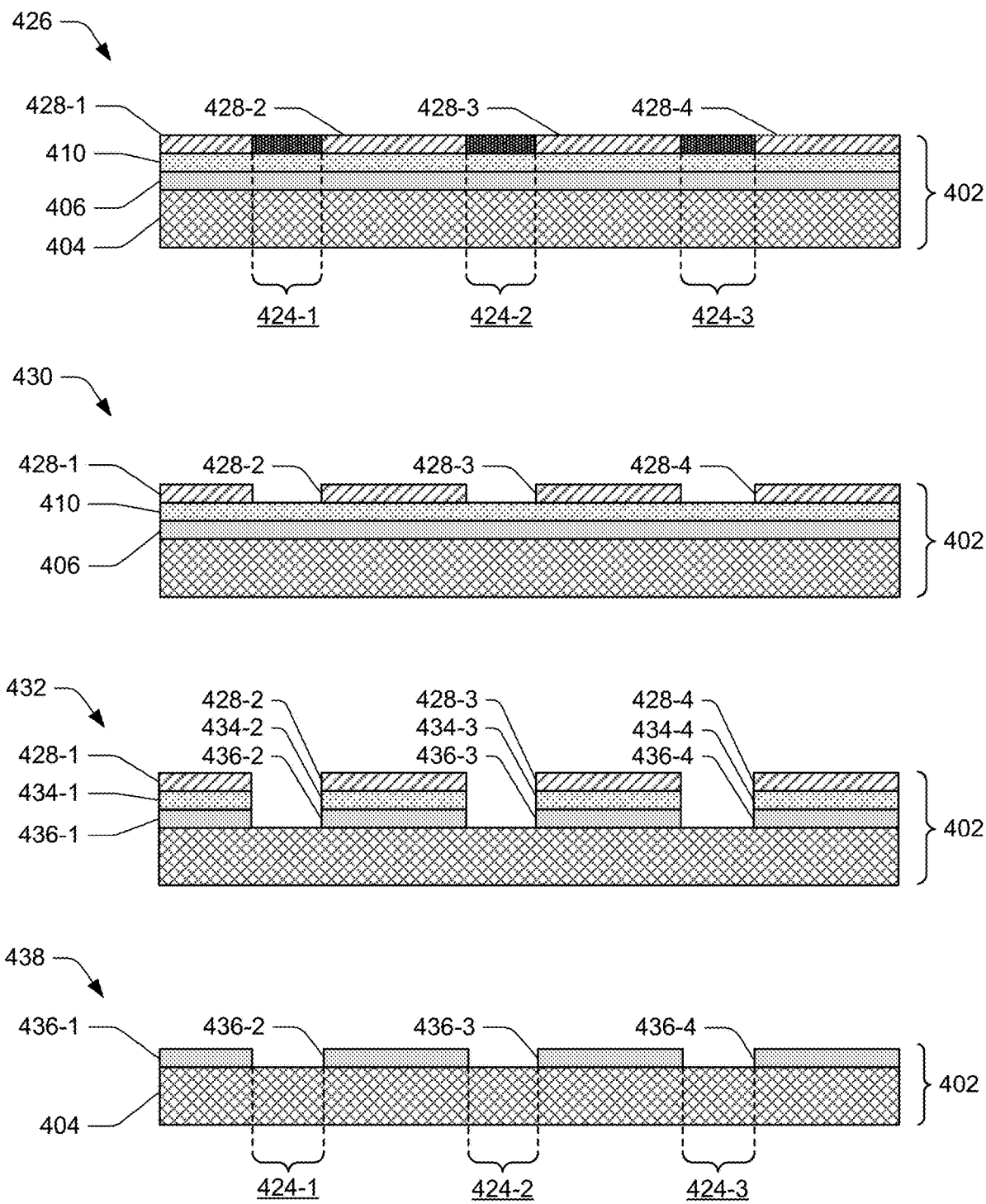

At 308, the mandrels are removed from the material stack. In the context of the present example and as shown at operation 426 of FIG. 4b, the mandrels (previously illustrated as 414-1 through 414-3) are removed, leaving silicon substrate 404, the film 406 to be patterned, the second layer of material 410, the exposed portions of the first layer of material 424-1 through 424-3, and unexposed portions of the first layer of material 428-1 through 428-4. Note that the unexposed portions of the first layer of material 428-1 through 428-4 are comprised of previously illustrated occluded portions of the first layer of material 422-1 through 422-4, as well as portions of the first layer of material that the mandrels 414-1 through 414-3 were fabricated upon. In some cases, the mandrels may be removed using one or more semiconductor manufacturing processes, including a process that may be a wet etch, a dry etch, a develop, a chemical-mechanical polish, or a backgrind process.

At 310, portions of the first layer of material that were exposed to the field of collimated energy are removed. As illustrated at 430, portions of the first layer of material that were exposed to the field of collimated energy (previously illustrated exposed portions 424-1 through 424-3) are removed. The unexposed portions of the first layer of material 428-1 through 428-4 remain, serving to mask portions of the second layer of material 410 and the film 406 to be patterned. Removal of the portions of the first layer of material that were exposed to the field of collimated energy may be accomplished using a semiconductor manufacturing process suitable to the nature of the first layer of material. For example, if the first layer of material is a positive photoresist material, a developing process using a developing solution may be used.

At 312, portions of the second layer of material and portions of the film that are no longer masked are removed. As illustrated at with the ongoing example at operation 432, portions of the second layer of material and the film not masked by the unexposed portions of the first layer of material 428-1 through 428-4 are removed, leaving other portions of the second layer of material 434-1 through 434-4 and portions of the film 436-1 through 436-4. The respective materials are removed using a single step or a multiple-step semiconductor manufacturing process comprised of a wet etch or dry etch processes.

At 314, unexposed portions of the first layer of material and other portions of the second layer of material are removed to expose a remaining patterned film. As illustrated at operation 438, unexposed portions of the first layer of material (e.g. previously illustrated as the unexposed portions 428-1 through 428-4) are removed. The unexposed portions of the first layer of material may be removed using, for example, an ashing process. Subsequently, other portions of the second layer of material (previously illustrated as the other portions 434-1 through 434-4) are removed using a semiconductor manufacturing process that is a wet etch or a dry etch process. The semiconductor wafer 402 has now been processed to produce a silicon substrate 404 with portions of the film 436-1 through 436-4 exposed to form a remaining patterned film on the silicon substrate 404.

Figure 5:
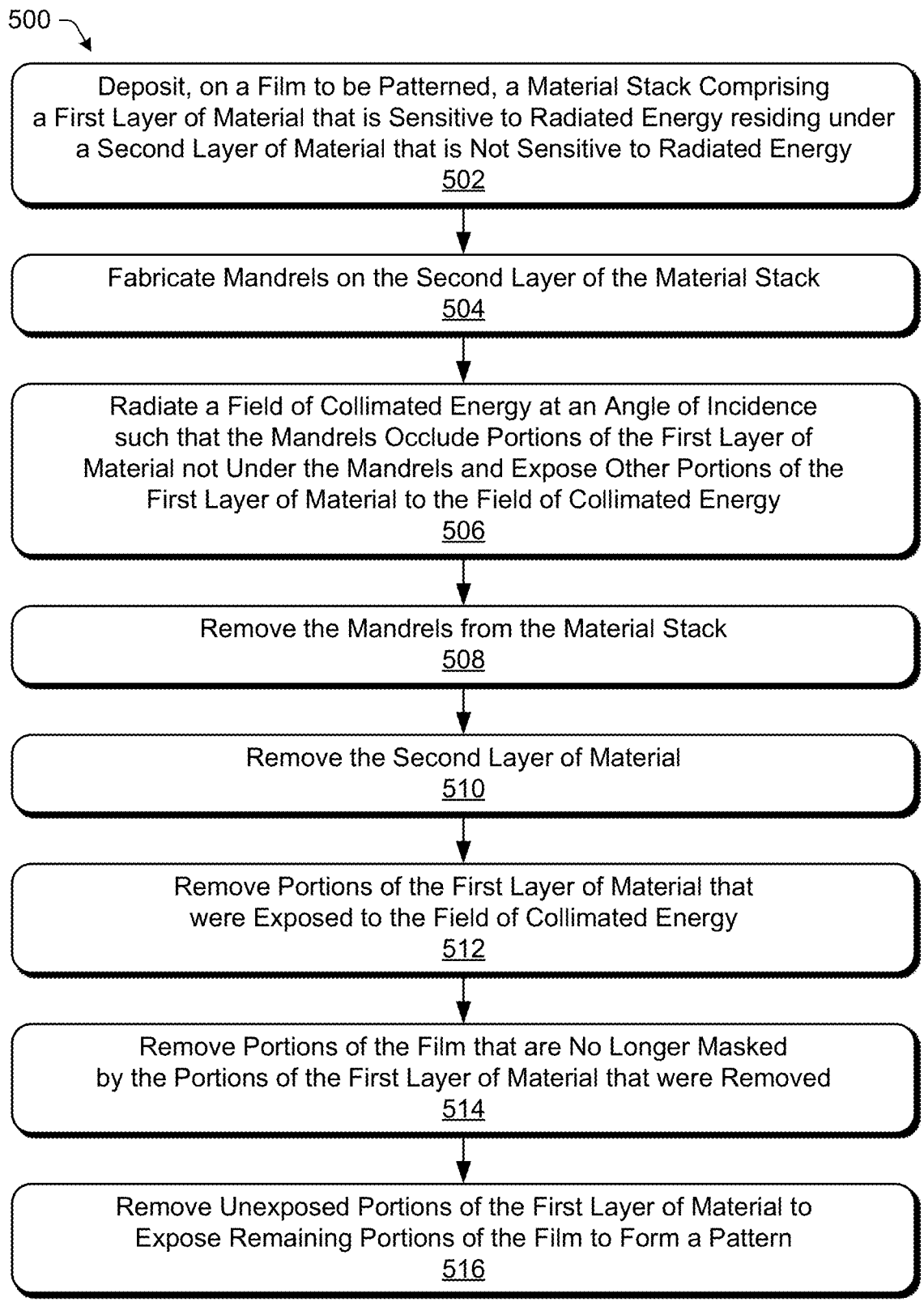
FIG. 5 depicts another example method for fabricating an IC die with a lower layer of energy sensitive material.

FIG. 5 depicts another example method for fabricating an IC die in accordance with one or more aspects, including operations performed by the lithography tool 102, control system 110, or tilt controller 124 of FIG. 1.

At 502 a material stack is deposited on a film to be patterned on a semiconductor wafer as part of an IC die fabrication process. The material stack is comprised of a first layer of material under a second layer of material. In some aspects, the first layer of material is a material that is sensitive to radiated energy while the second layer of material is a material that is not sensitive to radiated energy.

Figure 6A:
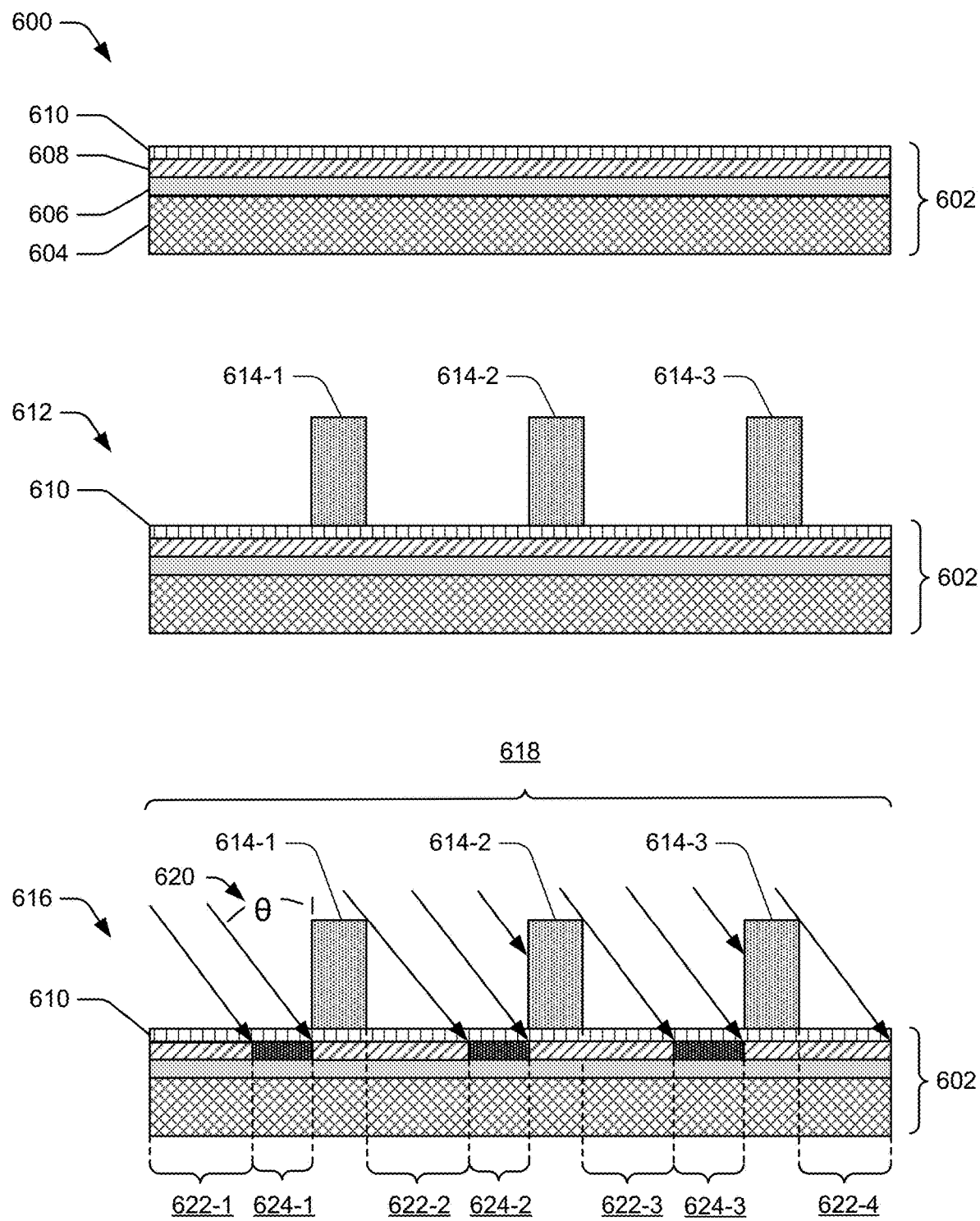
FIGS. 6a-6b illustrate other example cross sections of an IC die at various stages of being fabricated in accordance with one or more aspects.

By way of example, consider FIG. 6a, which illustrates other cross sections of an IC die at various stages of being fabricated in accordance with one or more aspects. As shown at 600, the semiconductor wafer 602 includes a silicon substrate 604 and a film 606 to be patterned. On top of the film 606 to be patterned is a material stack comprised of first layer of material 608 under a second layer of material 610. In this example, the first layer of material 608 is comprised of a material that is sensitive to radiated energy, e.g., a positive photoresist material. The second layer of material 610 includes a material that is not sensitive to radiated energy, such as silicon dioxide implanted with argon or oxygen. The film 606, the first layer of material 608, and the second layer of material 610 may be blanketly formed using any one of a number of semiconductor manufacturing processes including chemical vapor deposition (CVD) or spin-coating processes.

At 504, mandrels are fabricated on the second layer of the material stack. In the context of the ongoing example and as shown at 612, mandrels 614-1 through 614-3 are fabricated on the second layer of material 610 of the material stack. The mandrels 614-1 through 614-3 may be fabricated using a low-cost lithography and etch process and materials that do not transmit radiated energy.

At 506, a field of collimated energy is radiated at an angle of incidence such that the mandrels fabricated on the material stack occlude portions of the first layer of material not under the mandrels from the field of collimated energy and expose other portions of the first layer of material to the field of collimated energy.

As shown at 616 as part of the present example, a field of collimated energy 618 is radiated at an angle of incidence 620 relative to the mandrels 614-1 through 614-3 using a lithography tool, such as the lithography tool 102 having the tilt controller 124. In some cases, the angle of incidence 620 may be a result of the tilt controller 124 varying an angular position of one or more components of either the exposure module 112 or the wafer module 120 of the lithography tool 102. The second layer of material 610 is such that it is not sensitive to the field of collimated energy 618 and, as such, the field of collimated energy 618 passes through the second layer of material 610. The angle of incidence 620 is such that portions 622-1 through 622-4 of the first layer of material 608, however, are occluded from the field of collimated energy 618 (portion 622-1 is occluded from the field of collimated energy 618 by a mandrel which is not illustrated, while portions 622-2 through 622-4 are occluded, respectively, by mandrels 614-1 through 614-3). Other portions 624-1 through 624-3 of the first layer of material are exposed to the field of collimated energy 618.

Figure 6B:
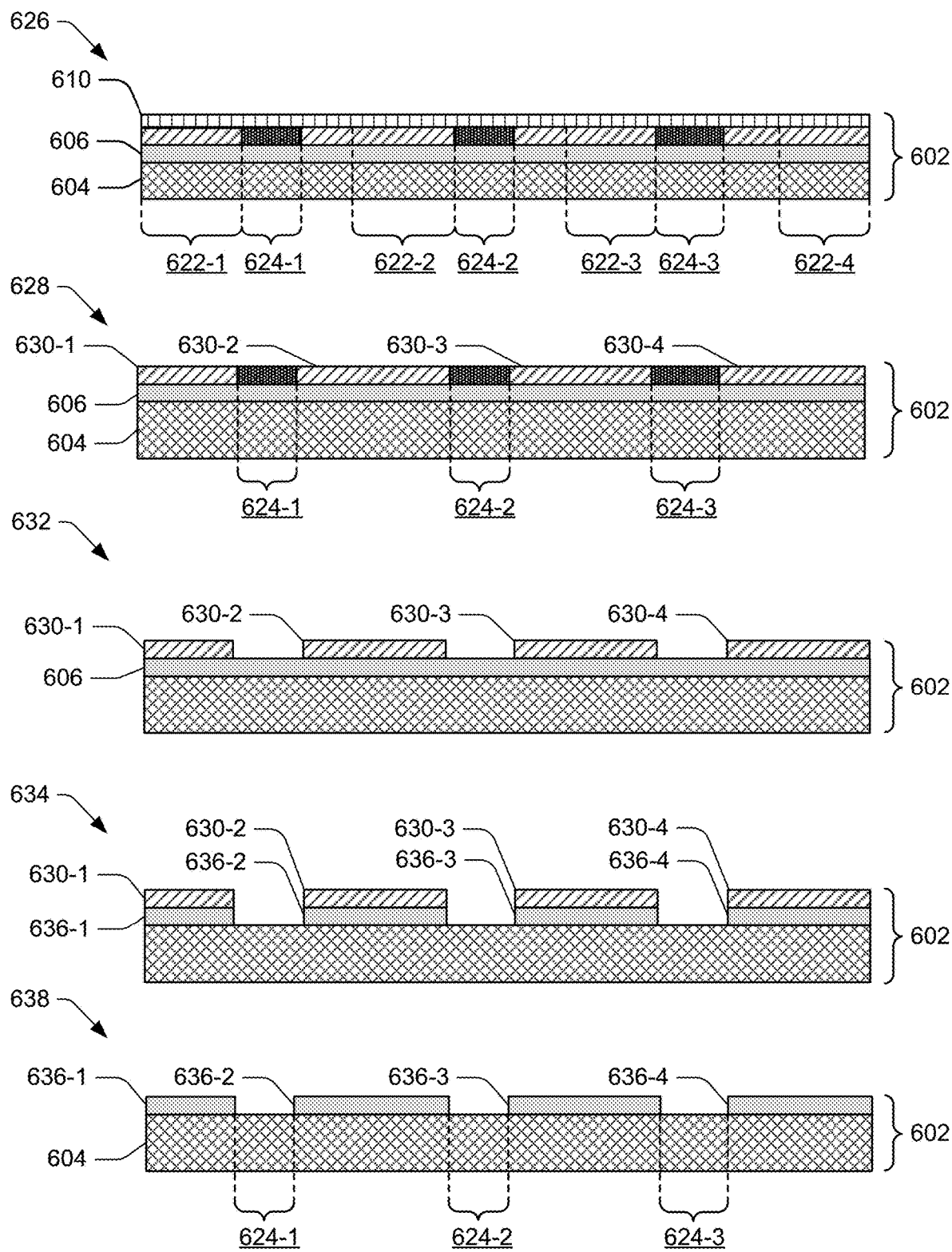

At 508, the mandrels are removed from the material stack. In the context of the present example and as shown at operation 626 of FIG. 6b, which continues illustration of the example, the semiconductor wafer 602, including the silicon substrate 604, the film 606 to be patterned, and the second layer of material 610, remains excluding the mandrels. Also included are the occluded portions 622-1 through 622-4 of the first layer of material as well as the other, exposed portions 624-1 through 624-3 of the first layer of material. In some cases, the mandrels may be removed using one or more semiconductor manufacturing processes, including a process that may be a wet etch, a dry etch, a develop, a chemical-mechanical polish, or a backgrind process.

At 510, the second layer of material is removed. Continuing with the present example and as shown at 628, the second layer of material (previously illustrated as 610) is removed, leaving the silicon substrate 604, the film 606 to be patterned, the exposed portions of the first layer of material 624-1 through 624-3, and unexposed portions of the first layer of material 630-1 through 630-4. Note that the unexposed portions of the first layer of material 630-1 through 630-4 are comprised of previously illustrated occluded portions 622-1 through 622-4 as well as portions of the first layer of material that the mandrels 614-1 through 614-3 were fabricated upon. In some cases, removal of the second layer of material may be accomplished using any one of a number of semiconductor manufacturing processes, including a wet etch or a dry etch process.

At 512, portions of the first layer of material that were exposed to the field of collimated energy are removed. Continuing with the ongoing example and as illustrated at 632, portions of the first layer of material that were exposed to the field of collimated energy (previously illustrated as 624-1 through 624-3) are removed. The unexposed portions of the first layer of material 630-1 through 630-4 remain, serving to mask portions of the film 606 to be patterned. The portions of the first layer of material are removed using a semiconductor manufacturing process suitable to the nature of the first layer of material; for example, if the first layer of material is a positive photoresist material, a developing process using a developing solution may be used.

At 514, portions of the film that are no longer masked are removed. As illustrated at operation 634 as part of the ongoing example, portions of the film not masked by portions 630-1 through 630-4 of the first layer of material are removed, leaving portions of the film 636-1 through 636-4 under the respective portions 630-1 through 630-4. The portions of the film that are no longer masked are removed using a semiconductor manufacturing process comprised of a wet etch or a dry etch process.

At 516, unexposed portions of the first layer of material are removed. After removal of the unexposed portions of the first layer of material, a remaining patterned film is exposed.

In the context of the present example and as illustrated at 638, portions of the first layer of material that were not exposed to the radiated energy (previously illustrated as 630-1 through 630-4) are removed. The portions of the first layer of material that were not exposed to the radiated energy may be removed using, for example, an ashing process. The semiconductor wafer 602 has now been processed to produce a silicon substrate 604 with remaining portions of the film 636-1 through 636-4, the remaining portions of the film 636-1 through 636-4 exposed to form a pattern on the silicon substrate 604.

Figure 7:
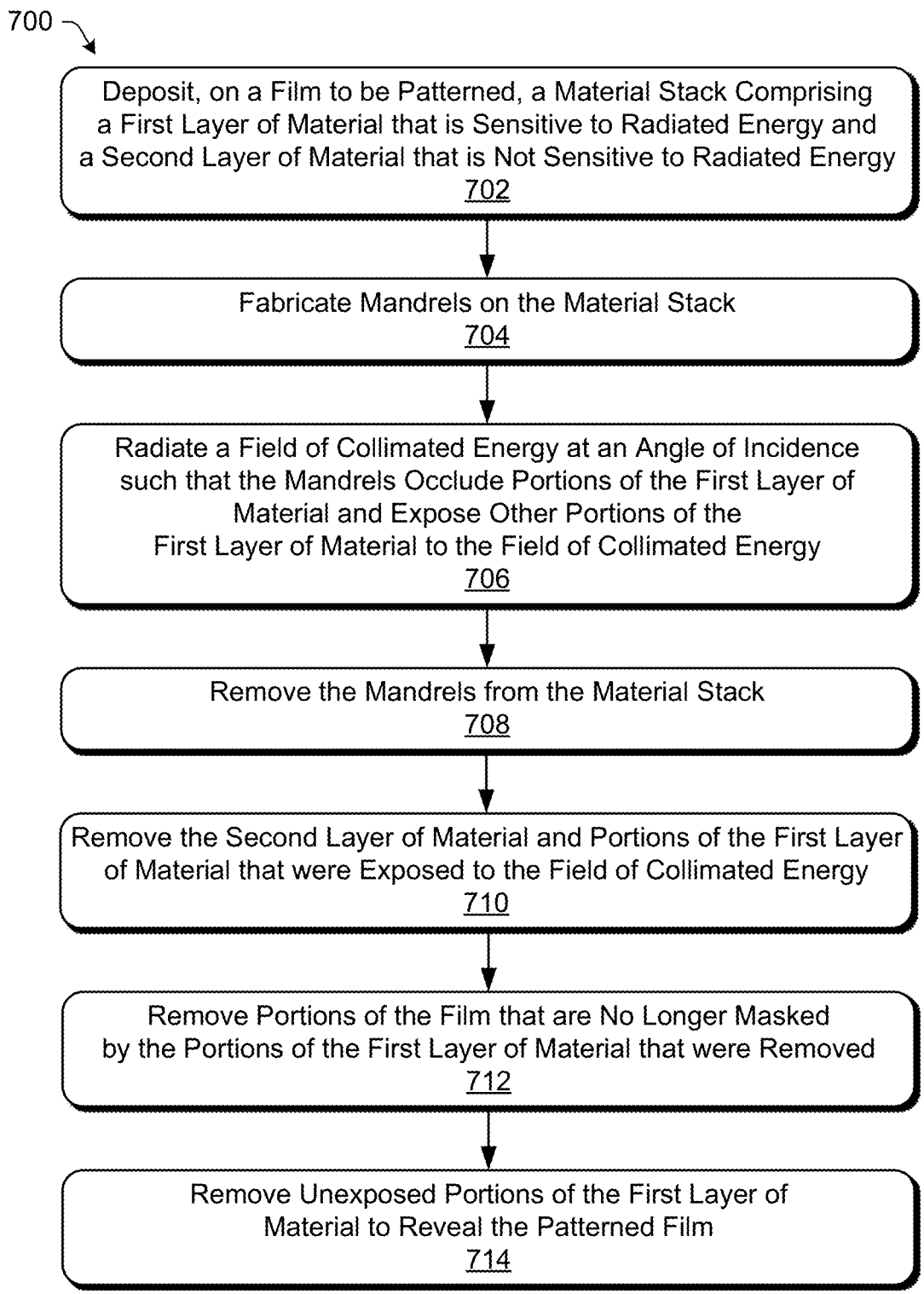
FIG. 7 depicts another example method for fabricating an IC die in accordance with one or more aspects.

FIG. 7 depicts another example method 700 for fabricating an IC die in accordance with one or more aspects, including operations performed by the lithography tool 102, control system 110, or tilt controller 124 of FIG. 1.

At 702 a material stack is deposited on a film to be patterned on a semiconductor wafer as part of an IC die fabrication process. The material stack is comprised of a first layer of material and a second layer of material. In some aspects, the first layer of material is a material that is sensitive to radiated energy while the second layer of material is a material that is not sensitive to radiated energy.

At 704, mandrels are fabricated on the material stack. The mandrels are fabricated from a material through which radiated energy cannot pass. At 706, a field of collimated energy is radiated at an angle of incidence such that the mandrels fabricated on the material stack occlude portions of the first layer of material and expose other portions of the first layer of material to the field of collimated energy. At 708, the mandrels are removed from the material stack.

At 710, portions of the first layer of material that were exposed to the field of collimated energy are removed. The second layer of material is also removed. At 712, portions of the film that are no longer masked by the portions of the first layer of material that were removed are removed. And, at 714, unexposed portions of the first layer of material are removed to reveal the patterned film.

In method 700, and depending on if the first layer of material resides over or under the second layer of material, certain steps (as detailed in methods 300 and 500, respectively) may be included as part of method 700.

Figure 8:
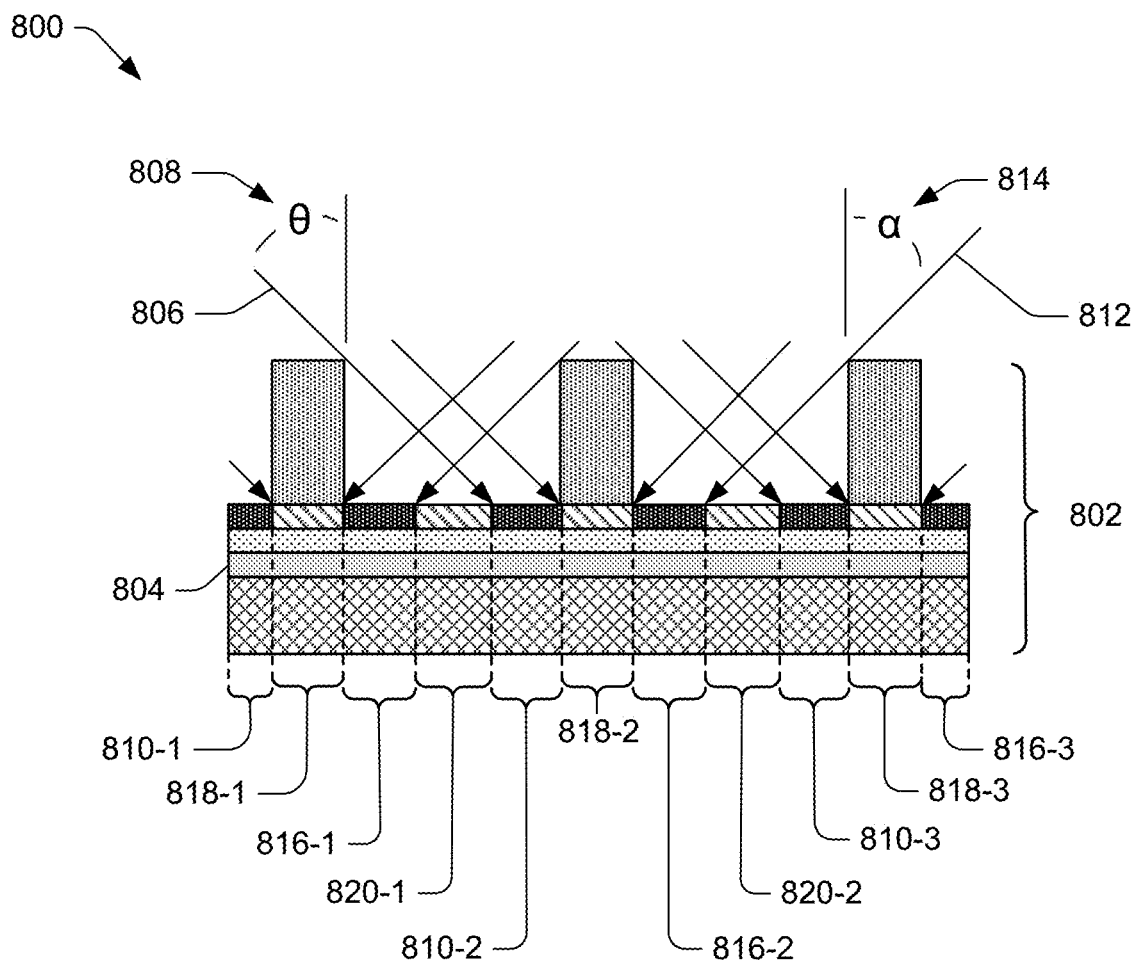
FIG. 8 illustrates example cross sections of an IC die fabricated through iterative tilted patterning.
Figure 8:
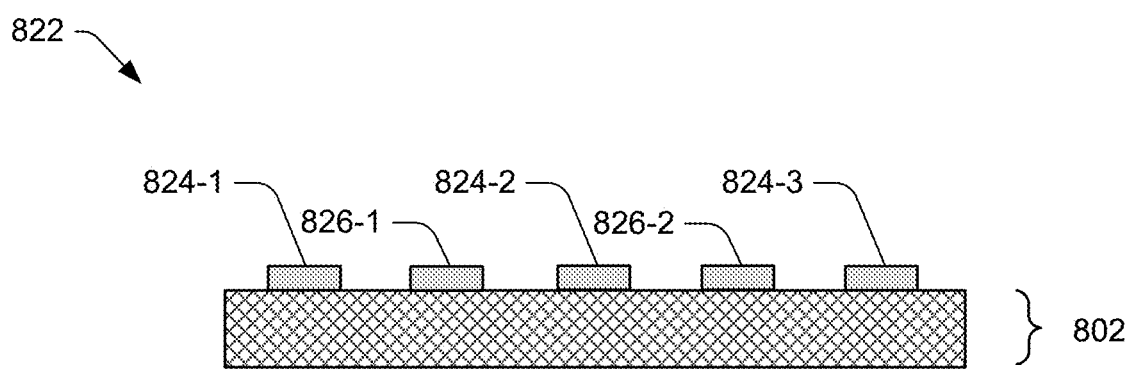

Tilted patterning techniques may include multiple, iterative exposures using a lithography tool, such as lithography tool 102, to produce feature sizes that extend below those afforded using a single exposure without tilted patterning. FIG. 8 illustrates example cross sections of an IC die fabricated using an iterative tilted patterning techniques.

At 800, a semiconductor wafer 802 being used to fabricate IC die includes a film 804 to be patterned as well as a material stack and mandrels in accordance with previously described implementations. During a first exposure a first field of collimated energy 806 is radiated at a first angle of incidence 808 relative to the mandrels. The first field of collimated energy 806 interacts with portions of a layer of material 810-1 through 810-3. Subsequently, a second exposure is performed where the lithography tool radiates a second field of collimated energy 812 at a second angle of incidence 814 relative to the mandrels. The second field of collimated energy 812 interacts with other portions 816-1 through 816-3 of the layer of material. Such a dual exposure is effective to generate a layer of material having portions of unexposed material 818-1 through 818-3, located directly under the mandrels, and other portions of unexposed material 820-1 and 820-2, the other portions of unexposed material 820-1 and 820-2 a result of the mandrels occluding respective fields of collimated energy at the respective angles of incidence.

Operation 822 illustrates the effects of the dual exposure at 800 after further processing. In accordance with previous techniques, after removal of materials in the material stack, portions of the film 824-1 through 824-3, masked from being removed by the previously illustrated portions of unexposed material 818-1 through 818-3, remain. Also remaining are other portions of the film 826-1 and 826-2, masked from being removed by the previously illustrated other portions of unexposed material 820-1 and 820-2. The remaining portions of the film 824-1 through 824-3 and the remaining other portions of the film 826-1 and 826-2 form a pattern on the semiconductor wafer 802.

Figure 9:
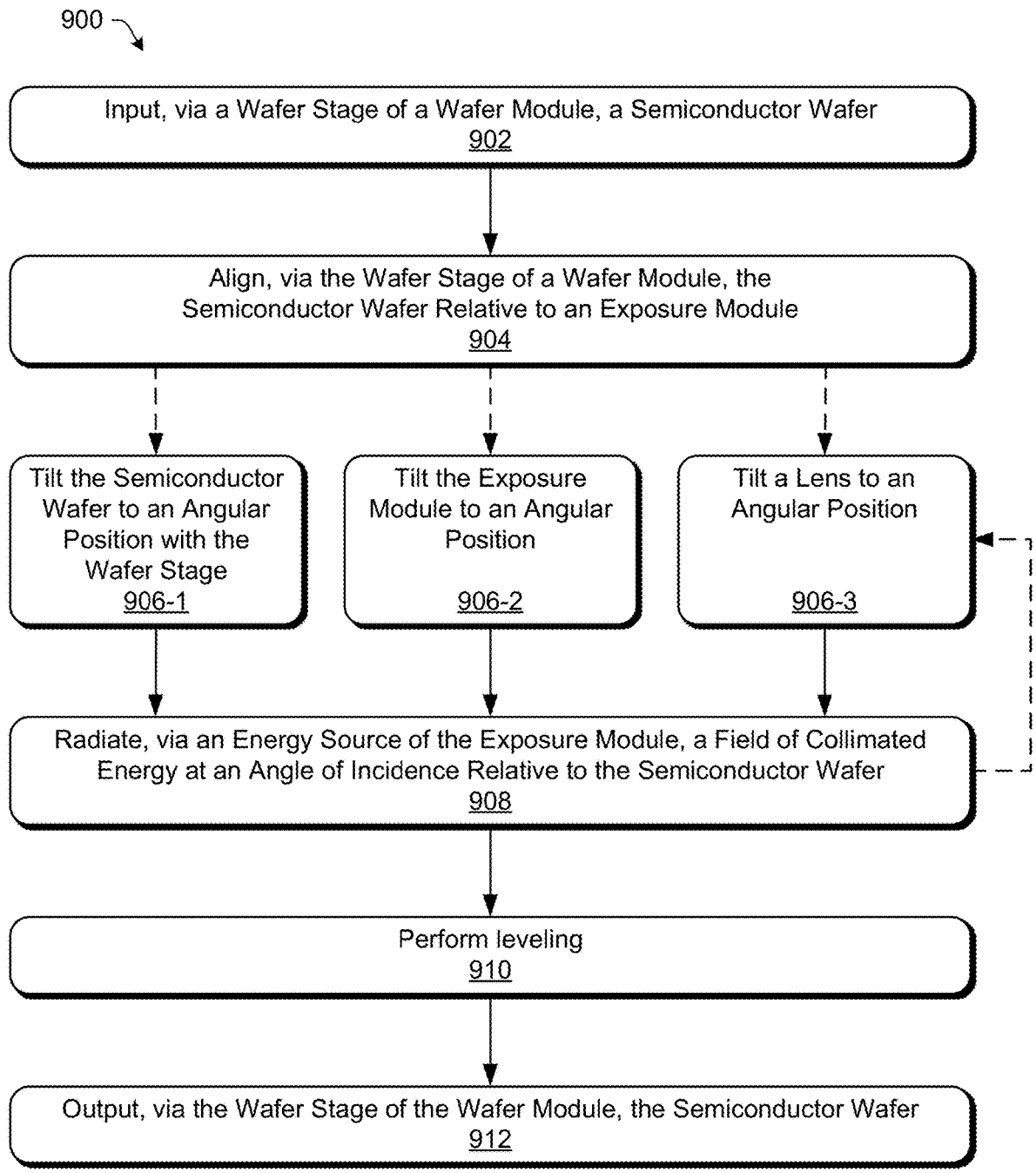
FIG. 9 depicts an example method for tilting components of a lithography tool in accordance with one or more aspects.

FIG. 9 depicts an example method for tilting components of a lithography tool in accordance with one or more aspects. The method includes operations performed by the lithography tool 102, control system 110, or tilt controller 124 of FIG. 1.

At 902, a semiconductor wafer is input to a lithography tool and at 904 the semiconductor wafer is aligned via a wafer stage relative to an exposure module. The semiconductor wafer may be the semiconductor wafer 104 of FIG. 1 and aligned using the wafer stage 122 of the wafer module 120 of FIG. 1. Additionally, the exposure module may be the exposure module 112 of FIG. 1.

After alignment, an angle of incidence between the semiconductor wafer and a field of collimated energy to be radiated may be introduced through one or more mechanisms of the lithography tool 102. As a first option, at 906-1 the wafer stage is tilted to an angular position relative to the exposure module 112. The wafer stage 122 may be tilted to the angular position using the tilt controller 124 of FIG. 1. As a second option, and as shown at 906-2, the exposure module 112 may be tilted to an angular position using the tilt controller 124. And for a third option, as illustrated at 906-3, a lens that is part of a lens system, such as the lens system 118 of FIG. 1, may be tilted to an angular position using the tilt controller 124. As noted above, any individual operation 906-1 through 906-3, or combination of operations 906-1 through 906-3, may be performed. Accordingly, an individual angular position or aggregate of angular positions may serve to create the angle of incidence between the semiconductor wafer and the field of collimated energy to be radiated.

At 908, a field of collimated energy is radiated from an energy source at an angle of incidence relative to the semiconductor wafer. The energy source may be the energy source 114 of FIG. 1. The radiated field of collimated energy may be in the form of ultraviolet (UV) light, extreme-ultraviolet (EUV) light, electron beams (e-beam), ion beams, or x-ray electromagnetic waves and interact with one or more layers of material on the semiconductor wafer 104. As noted above, the angle of incidence may be a result of the tilt controller 124 varying any singular or combination of angular positions associated with the wafer stage 122, the exposure module 112, or the lens that is part of the lens system 118.

After 908, and in accordance with iterative tilted patterning previously described (see FIG. 7), a second exposure may be optionally performed. In this instance, and as illustrated, a second angle of incidence maybe introduced by repeating one or more of operations 906-1 through 906-3, after which a second field of collimated energy may be radiated.

At 910, leveling of the system is performed. Any component to which an angular position was introduced is leveled and returned to its state prior to radiating the field(s) of collimated energy. This includes leveling, by the tilt controller 124, the wafer stage 122, the exposure module 112, or the lens that is part of the lens system 118. At 912, the semiconductor wafer 104 is then output using the wafer stage 122 for further processing.

Additional variations may be introduced to these tilted-patterning techniques. These variations include modification of exposure doses, customizing mandrels to produce desired occlusion or shadowing effects, multiple or differing collimated energy sources, and multiple exposures encompassing multiple radial angles of a semiconductor wafer surface (e.g., 0 to 360 degrees). Tilted-patterning techniques can be optionally combined with traditional lithography techniques in one lithography cycle (in other words, certain portions of an IC die having high-density patterns could be fabricated using tilted-patterning techniques while other parts of the IC die would be fabricated using traditional lithography techniques).

Lithography Tools

The following discussion is specific to lithography tools that may be used in accordance with previously described techniques for IC die fabrication using tilted patterning. These tools can be the lithography tool 102 implemented using any of the environments and entities described herein, such as the operating environment 100 and the semiconductor wafer 104. Methods utilized by the tools are not necessarily limited to the orders of operations shown. Rather, any of the operations may be repeated, skipped, substituted, or re-ordered to implement various aspects described herein. Further, these methods may be used in conjunction with one another, in whole or in part, whether performed by the same entity, separate entities, or any combination thereof.

Figure 10A:
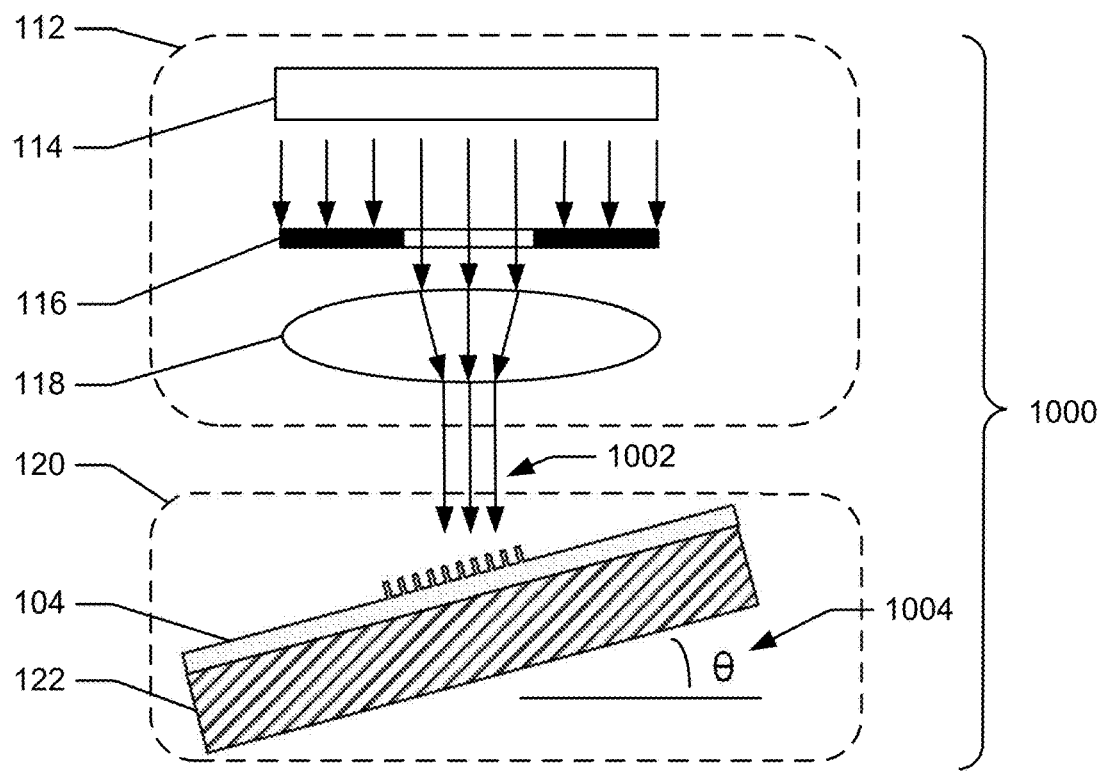
FIGS. 10a-10c illustrate example configurations of lithography tools for implementing tilted patterning in accordance with one or more aspects.
Figure 10B:
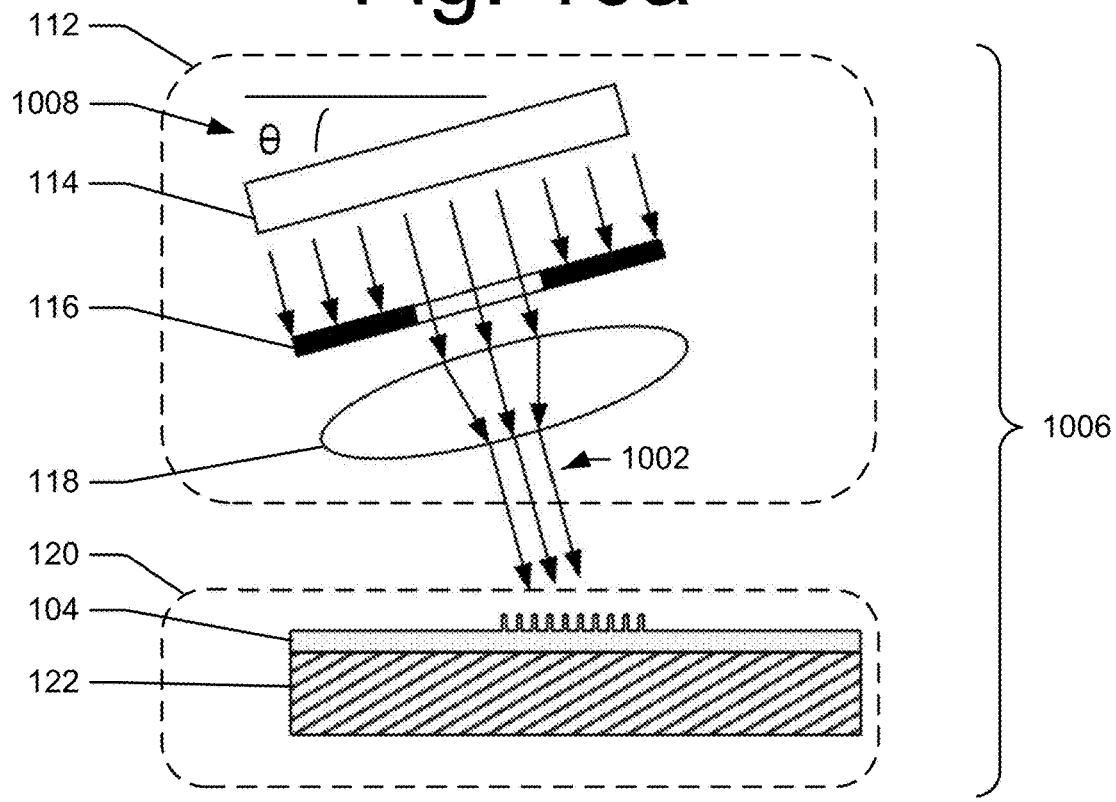
Figure 10C:
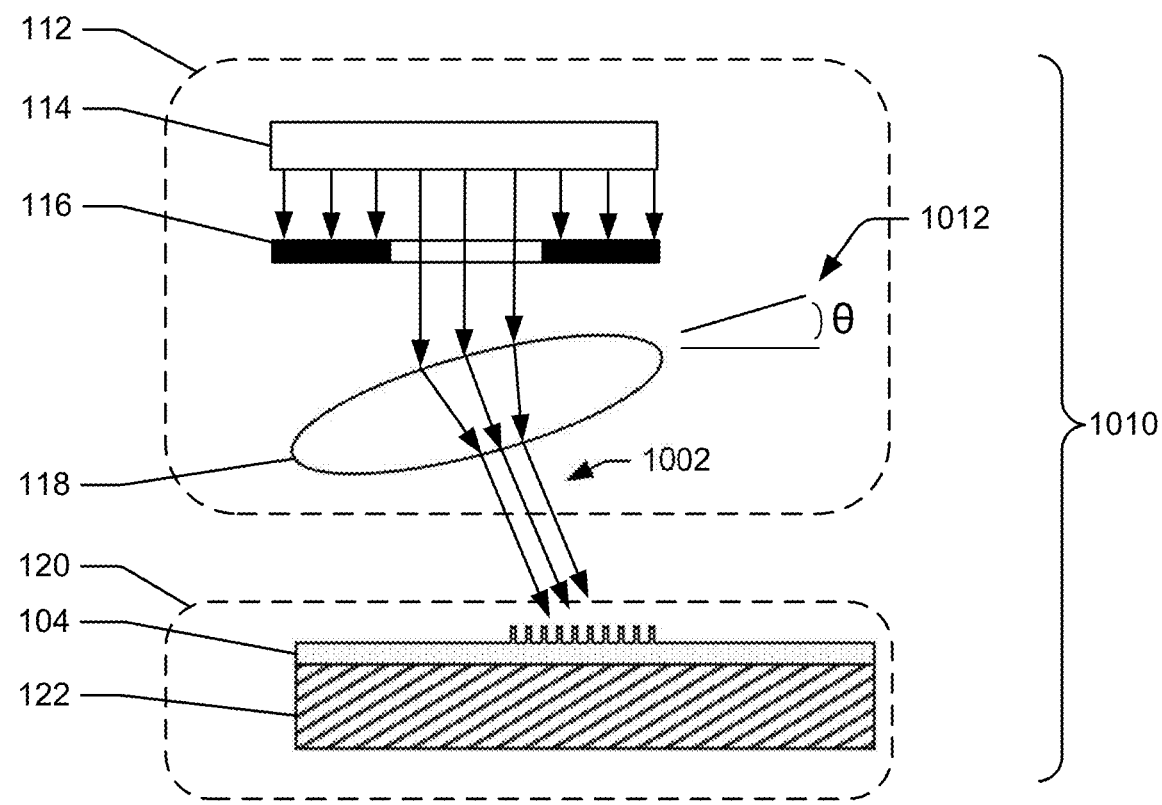

FIGS. 10a-10c illustrate example configurations of lithography tools for implementing tilted patterning in accordance with one or more aspects of operating environment 100. In FIGS. 10a-10c, one or more components of the photolithography tools can be managed or caused to act, such as by the tilt controller 124, in order to introduce an angle of incidence between a field of collimated energy and a semiconductor wafer as described throughout the disclosure.

FIG. 10a illustrates an example configuration 1000 of a lithography tool that is configured to enable tilting of a semiconductor wafer 104. In this example, the semiconductor wafer 104 is configured for IC die fabrication with a film to be patterned, a material stack, and mandrels, such as those described with reference to FIG. 2. The semiconductor wafer 104 is presented for exposure to a field of collimated energy 1002 by a wafer module 120 in a photolithography tool, such as the lithography tool 102. The wafer is positioned using a wafer stage 122, which may be tilted at a wafer stage tilt angle 1004 by a tilt controller, such as the tilt controller 124 of the lithography tool 102. The field of collimated energy 1002 originates in an exposure module 112 from an energy source 114, passes through a lithography mask 116, and is reduced using a lens of the lens system 118. The field of collimated energy 1002, by virtue of the wafer stage tilt angle 1004, radiates onto the surface of the semiconductor wafer 104 at an angle of incidence equivalent to the wafer stage tilt angle 1004, effective to have the mandrels on the semiconductor wafer 104 occlude portions of a layer of material from the field of collimated energy 1002 as previously described.

Alternatively, as illustrated by FIG. 10b and by configuration 1006, a lithography tool is configured to enable tilting of an exposure module 112. In this example, a semiconductor wafer 104 is configured for IC die fabrication with a film to be patterned, a material stack, and mandrels, such as those described with reference to FIG. 2. The wafer is positioned using a wafer stage 122 of a wafer module 120. A field of collimated energy 1002 is radiated from an energy source 114 contained in an exposure module 112. The exposure module 112 is tilted at an exposure module tilt angle 1008 by a tilt controller, such as the tilt controller 124 of the lithography tool 102. The field of collimated energy 1002 originates from the energy source 114, passes through a lithography mask 116, and is reduced using a lens of a lens system 118. The field of collimated energy 1002, by virtue of the exposure module tilt angle 1008, radiates onto the surface of the semiconductor wafer 104 at an angle of incidence equivalent to the exposure module tilt angle 1008. This is effective to have the mandrels on the semiconductor wafer 104 occlude portions of a layer of material from the field of collimated energy 1002 as previously described.

FIG. 10c illustrates another example configuration 1010 of a lithography tool that is configured to enable tilting of a lens of a lens system 118. The semiconductor wafer 104 is configured for IC die fabrication with a film to be patterned, a material stack, and mandrels, such as those described with reference to FIG. 2. The wafer is positioned using a wafer stage 122 of a wafer module 120. A field of collimated energy 1002 is radiated from an energy source 114 contained in an exposure module 112. A lens of the lens system 118 is tilted at a lens tilt angle 1012 by a tilt controller, such as the tilt controller 124 of the lithography tool 102. The field of collimated energy 1002 originates from the energy source 114, passes through a lithography mask 116 having a pattern, and is reduced using a lens of the lens system 118. The field of collimated energy 1002, by virtue of the lens tilt angle 1012, radiates onto the surface of the semiconductor wafer 104 at an angle of incidence equivalent to the lens tilt angle 1012, effective to have the mandrels on the semiconductor wafer 104 occlude portions of a layer of material from the field of collimated energy 1002 as previously described.

Additional optimizations for tilted patterning may be applied to a lens of the lens system 118 contained in the exposure module 112 of the lithography tool 102. Optimizations may include altering the numerical aperture of the lens in order to maintain a depth of focus needed for precision during exposure of radiated energy. Another optimization may include manufacturing the lens system 118 such that refraction and/or reflection of energy occurs internal to the lens system 118, effective to augment or supplant other mechanisms used by the lithography tool 102 to introduce an angle of incidence.

Although the subject matter has been described in language specific to structural features and/or methodological operations, it is to be understood that the subject matter defined in the appended claims is not necessarily limited to the specific features or operations described herein, including orders in which they are performed.

What is claimed is:

1. A method comprising:
   depositing a material stack onto a film to be patterned, the material stack including a first layer of material that is sensitive to radiated energy disposed over a second layer of material that is not sensitive to radiated energy;
   fabricating, from a material through which radiated energy cannot pass, mandrels onto the material stack, the mandrels fabricated onto the first layer of material that is sensitive to radiated energy;

radiating a field of collimated energy at an angle of incidence with respect to the mandrels such that the mandrels (i) occlude first portions of the first layer of material from the field of collimated energy and (ii) expose second portions of the first layer of material to the field of collimated energy;

removing the mandrels from the material stack;

removing the second portions of the first layer of material that were exposed to the radiated field of collimated energy;

removing portions of the second layer of material and the film that are no longer masked by the second portions of the first layer of material that were removed; and removing unexposed portions of the first layer of material and other portions of the second layer of material to reveal the patterned film, the unexposed portions of the first layer of material including the first portions of the first layer of material that were occluded from the radiated field of collimated energy.

2. The method as recited by claim 1, wherein depositing the material stack onto the film to be patterned includes depositing, as the first layer of material, a layer of positive photoresist material over the second layer of material.

3. The method as recited by claim 2, wherein depositing the layer of positive photoresist material includes using a spin-coat process to deposit the layer of positive photoresist material over the second layer of material.

4. The method as recited by claim 2, wherein removing the second portions of the first layer of material includes using a develop process to remove the second portions of the first layer of material.

5. The method as recited by claim 1, wherein fabricating the mandrels onto the material stack comprises fabricating the mandrels using a lithography process.

6. The method as recited by claim 1, wherein radiating the field of collimated energy includes radiating one of ultraviolet light, extreme-ultraviolet light, x-ray electromagnetic waves, a beam of ions, or a beam of electrons at the angle of incidence with respect to the mandrels.

7. The method as recited by claim 1, wherein removing the mandrels from the material stack comprises using a process that includes one of a wet etch, a dry etch, a develop, a chemical-mechanical polish, or a backgrind to remove the mandrels from the material stack.

8. The method as recited by claim 1, wherein removing the portions of the second layer of material and the film that are no longer masked by the second portions of the first layer of material includes using an etching process to remove the portions of the second layer of material and the film that are no longer masked.

9. The method as recited by claim 1, wherein removing the first portions of the first layer of material includes using an ashing process to remove the first portions of the first layer of material.

10. The method as recited by claim 1, wherein the film to be patterned is a polysilicon film.

11. The method as recited by claim 1, wherein the film to be patterned is a dielectric film.

12. The method as recited by claim 1, wherein depositing the material stack onto the film to be patterned includes depositing, as the second layer of material, a layer of silicon nitride material over the film to be patterned.

13. The method as recited by claim 12, wherein depositing the layer of silicon nitride material includes using a chemical vapor deposition process to deposit the layer of silicon nitride material over the film to be patterned.

14. The method as recited by claim 1, wherein depositing the material stack onto the layer of film to be patterned further includes depositing a layer of silicon dioxide material.

15. The method as recited by claim 14, wherein depositing the layer of the silicon dioxide material includes using a chemical vapor deposition process to deposit the layer of silicon dioxide material over the first layer of material that is sensitive to radiated energy.

16. The method as recited by claim 15, wherein depositing the layer of silicon dioxide material further includes implanting the layer of silicon dioxide material with argon.

17. The method as recited by claim 1, wherein radiating the field of collimated energy at the angle of incidence with respect to the mandrels radiates the field of collimated energy onto:

the mandrels formed from the material through which radiated energy cannot pass; and the second portions of the first layer of material that are not occluded by the mandrels.

18. The method as recited by claim 1, wherein removing the unexposed portions of the first layer of material includes removing third portions of the first layer of material that correspond to areas of the first layer of material over which the mandrels are fabricated.

19. A method comprising:

depositing a material stack onto a film to be patterned, the material stack including a first layer of a photoresist material that is sensitive to radiated light disposed over a second layer of another material that is not sensitive to the radiated light;

fabricating, from a material through which the radiated light cannot pass, mandrels onto the material stack, the mandrels fabricated over the first layer of the photoresist material that is sensitive to radiated light;

radiating a field of collimated light at an angle of incidence with respect to the mandrels such that the mandrels (i) occlude first portions of the first layer of the photoresist material from the field of collimated light and (ii) expose second portions of the first layer of the photoresist material to the field of collimated light;

removing the mandrels from the material stack;

removing the second portions of the first layer of the photoresist material that were exposed to the radiated field of collimated light using a develop process;

removing portions of the second layer of the other material and the film that are no longer masked by the second portions of the first layer of the photoresist material that were removed; and removing unexposed portions of the first layer of the photoresist material and other portions of the second layer of the other material to reveal the patterned film, the unexposed portions of the first layer of the photoresist material including the first portions of the first layer of the photoresist material that were occluded from the radiated field of collimated light.

20. The method as recited by claim 19, wherein the radiated field of collimated light is an ultraviolet light.

21. The method as recited by claim 19, wherein the radiated field of collimated light is an extreme-ultraviolet light.

22. A method of patterning film with a material stack, the method comprising: depositing a film to be patterned on a silicon substrate; depositing, over the film to be patterned and as part of the material stack, a first layer of a material that is not sensitive to radiated energy; depositing, over the first layer of material and as part of the material stack, a second layer of a material that is sensitive to radiated light; forming, over the second layer of material of the material stack, a plurality of mandrels from a material through which radiated light cannot pass; radiating a field of collimated light at an angle of incidence with respect to the plurality of mandrels such that the mandrels (i) occlude first portions of the second layer of material from the field of collimated light and (ii) do not occlude second portions of the second layer of material from the field of collimated light; removing, after radiating the field of collimated light, the mandrels from the material stack; removing, after removing the mandrels from the material stack, the second portions of the second layer of material that were not occluded from the radiated field of collimated light; removing respective portions of the film and the first layer that are no longer masked by the second portions of the second layer of material; and removing the first portions of the second layer of material that were not exposed to the fled of collimated light and remaining portions of the first layer of material to reveal the film that remains on the silicon substrate as a patterned film.

23. The method as recited by claim 22, wherein depositing the film on the silicon substrate includes depositing, as the film, a layer of a dielectric material on the silicon substrate.

24. The method as recited by claim 22, wherein depositing the second layer of the material includes depositing, as the second layer of material, a layer of a photoresist material over the first layer of material that is not sensitive to radiated energy.

25. The method as recited by claim 22, further comprising depositing, as part of the material stack, a third layer of a third material over the second layer of material of the material stack and wherein the mandrels are formed on the third layer of material.

26. The method as recited by claim 25, wherein depositing the third layer of the third material includes depositing a layer of silicon dioxide material that is implanted with Argon.

* * * * *